(12) United States Patent
Hill et al.

(10) Patent No.: US 7,017,001 B2
(45) Date of Patent: Mar. 21, 2006

(54) COMPACT PCI BACKPLANE AND METHOD OF DATA TRANSFER ACROSS THE COMPACT PCI BACKPLANE

(75) Inventors: Charles C. Hill, Gilbert, AZ (US); John H. Kelly, Phoenix, AZ (US); Henry Wong, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 364 days.

(21) Appl. No.: 10/417,764

(22) Filed: Apr. 16, 2003

(65) Prior Publication Data

US 2004/0210700 A1  Oct. 21, 2004

(51) Int. Cl.
*G06F 13/14* (2006.01)

(52) U.S. Cl. ............... 710/314; 710/305; 710/312
(58) Field of Classification Search ........ 710/300–306, 710/312–317, 36–38, 2–5, 31; 439/82–83; 361/785, 752
See application file for complete search history.

(56) References Cited

U.S. PATENT DOCUMENTS

| | | | | |
|---|---|---|---|---|
| 6,112,271 | A * | 8/2000 | Lanus et al. ............... | 710/306 |
| 6,282,599 | B1 * | 8/2001 | Gallick et al. ............. | 710/306 |
| 6,425,027 | B1 * | 7/2002 | Mills et al. ................ | 710/300 |
| 6,526,465 | B1 * | 2/2003 | Voth et al. ................. | 710/301 |
| 6,549,979 | B1 * | 4/2003 | Linnell ...................... | 711/114 |
| 6,578,103 | B1 * | 6/2003 | Hill et al. .................. | 710/313 |
| 6,580,616 | B1 * | 6/2003 | Greenside et al. ......... | 361/752 |
| 6,608,761 | B1 * | 8/2003 | Wachel ....................... | 361/785 |
| 6,662,254 | B1 * | 12/2003 | Tal et al. ..................... | 710/300 |
| 6,751,699 | B1 * | 6/2004 | Langley et al. ............. | 710/317 |
| 6,836,810 | B1 * | 12/2004 | Klem et al. ................. | 710/301 |
| 6,836,811 | B1 * | 12/2004 | Ho et al. ..................... | 710/301 |

* cited by examiner

*Primary Examiner*—Rehana Perveen
*Assistant Examiner*—Raymond N Phan
(74) *Attorney, Agent, or Firm*—Kevin D. Wills (57) ABSTRACT

A method of directly transferring data across a Compact-PCI™ backplane (170) via a fully meshed orthogonal network (370). The CompactPCI backplane (170) incorporates a different type connector at its P4 location, in conjunction with a standard family of IEC 61074 connectors at its P1, P2, P3, and P5 locations, to provide high speed data transfer with additional shielding and noise control.

15 Claims, 5 Drawing Sheets

| | | 437 | 437 | 439 | | 439 |
|---|---|---|---|---|---|---|
| 401 | GND | GND | GND | GND | GND | GND |
| | GND | | GND | | GND | |
| 403 | GND | 1-1TX+ | 1-1TX- | 1-1RX- | 1-1RX+ | GND |
| | GND | | GND | | GND | |
| 405 | GND | 1-2TX+ | 1-2TX- | 2-1RX- | 2-1RX+ | GND |
| | GND | | GND | | GND | |
| 407 | GND | 1-3TX+ | 1-3TX- | 3-1RX- | 3-1RX+ | GND |
| | GND | | GND | | GND | |
| 409 | GND | 1-4TX+ | 1-4TX- | 4-1RX- | 4-1RX+ | GND |
| | GND | | GND | | GND | |
| 411 | GND | 1-5TX+ | 1-5TX- | 5-1RX- | 5-1RX+ | GND |
| | GND | | GND | | GND | |
| 413 | GND | 1-6TX+ | 1-6TX- | 6-1RX- | 6-1RX+ | GND |
| | GND | | GND | | GND | |
| 415 | GND | 1-8TX+ | 1-8TX- | 8-1RX- | 8-1RX+ | GND |
| | GND | | GND | | GND | |
| 417 | GND | 1-10TX+ | 1-10TX- | 10-1RX- | 10-1RX+ | GND |
| | GND | | GND | | GND | |
| 419 | GND | 1-11TX+ | 1-11TX- | 11-1RX- | 11-1RX+ | GND |
| | GND | | GND | | GND | |
| 421 | GND | 1-12TX+ | 1-12TX- | 12-1RX- | 12-1RX+ | GND |
| | GND | | GND | | GND | |
| 423 | GND | 1-13TX+ | 1-13TX- | 13-1RX- | 13-1RX+ | GND |
| | GND | | GND | | GND | |
| 425 | GND | 1-14TX+ | 1-14TX- | 14-1RX- | 14-1RX+ | GND |
| | GND | | GND | | GND | |
| 427 | GND | 1-15TX+ | 1-15TX- | 15-1RX- | 15-1RX+ | GND |
| | GND | | GND | | GND | |
| 429 | GND | 1-16TX+ | 1-16TX- | 16-1RX- | 16-1RX+ | GND |
| | GND | | GND | | GND | |
| 431 | NC | NC | NC | NC | NC | NC |
| | GND | | GND | | GND | |
| 433 | GND | CK1+ | CK1- | CK2- | CK2+ | GND |

COMPACT PCI BACKPLANE AND METHOD OF DATA TRANSFER ACROSS THE COMPACT PCI BACKPLANE

FIELD OF THE INVENTION

The present invention relates to computer communication networks, in general, and to a backplane for communication and data transfer, in particular.

BACKGROUND OF THE INVENTION

The Peripheral Component Interconnect (PCI) bus has become the universal bus for virtually all high performance microprocessors. The PCI bus is used as an interconnect between boards in a system, as a method of hooking chips together on a board, and as a micro-architecture within chips. The PCI bus is the core of both PowerPC™ architectures and Intel Pentium™/Pentium II™ architectures.

The PCI bus may be part of a backplane, which is an electronic circuit board containing circuitry and sockets into which additional electronic devices on other circuit boards can be plugged. The PCI bus specification (the "Specification") provides a processor-independent interface to add-in boards, commonly referred to as expansion or adapter boards. Because of alternating current (AC) switching characteristic limitations, a PCI bus is typically limited in both data transfer rate and number of adapter slots supported. Adapter slots are areas on the PCI bus used to couple adapter boards to the PCI bus. Data transfer rate and the number of adapter slots supported in a PCI bus are interdependent, such that achieving an increase in one generally results in a decrease in the other. This data transfer rate is slow for many high performance adapter boards under contemporary workstation requirements. The current 66 Megahertz (MHz) PCI architecture definition provides a peak data transfer rate of 528 megabits per second, but only supports up to 2 slots per PCI bus. Other PCI architecture supporting up to 20 slots per PCI bus may transfer data up to approximately 80 megabits per second.

A CompactPCI™ standard is an adaptation of the Specification for industrial and/or embedded applications. The CompactPCI standard was developed by members of the PCI Industrial Computer Manufacturers Group (PICMG), a consortium of suppliers to the industrial computer and telecommunications markets. The robust nature and high performance of CompactPCI technology makes it attractive to developers of telecom and telephony equipment.

The CompactPCI standard uses industry standard mechanical components and high performance connector technologies to provide an optimized system. The CompactPCI standard provides a data processing system that is electrically and mechanically compatible with the Specification. Rear connectors for CompactPCI boards are numbered J1, starting at the bottom connector, through J5. Use of the connectors has been partially defined by the Specification as to location and signal-pin assignment.

A CompactPCI system is comprised of one or more CompactPCI bus segments. Each CompactPCI bus segment consists of one adapter slot and several peripheral slots. A CompactPCI backplane often incorporates the CompactPCI bus segments for communication and data transfer purposes. CompactPCI backplane slots for CompactPCI boards may be implemented with one or more connectors. Backplane connectors are designated as P1 through P5 corresponding in location to the CompactPCI board's connectors J1 through J5. For example, a CompactPCI board's J1 connector is coupled to a CompactPCI backplane's J1 connector.

In the telephony environment, many individual people may desire to talk to other individuals at the same time. In this common situation, large amounts of traffic are going back and forth requiring a significant data transfer rate capability in the gigabyte per second range. Today, a standard CompactPCI bus is capable of transferring between 33 and 80 megabits per second. Accordingly, there is a need for a reliable and economical CompactPCI bus architecture that is compatible with existing PCI and CompactPCI hardware, and that can transfer much larger amounts of data than currently available, to allow more users to use a single system.

BRIEF DESCRIPTION OF THE DRAWINGS

The invention will be better understood from a reading of the following detailed description taken in conjunction with the accompanying drawing figures, in which like reference indicators are used to designate like elements, and in which.

The elements in the drawing figures are not necessarily drawn to scale.

DETAILED DESCRIPTION OF THE DRAWINGS

Figure 1A:
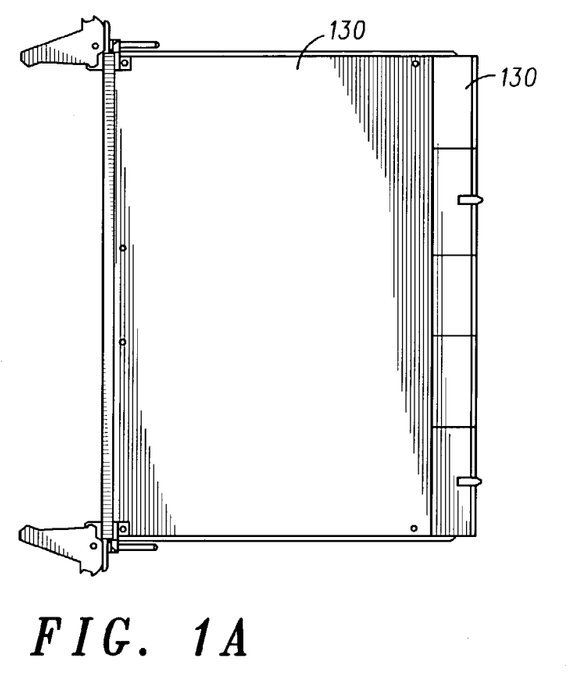
FIG. 1 is an exploded side view of a CompactPCI™ backplane with aligned CompactPCI boards and transition boards in accordance with an embodiment of the invention.
Figure 1B:
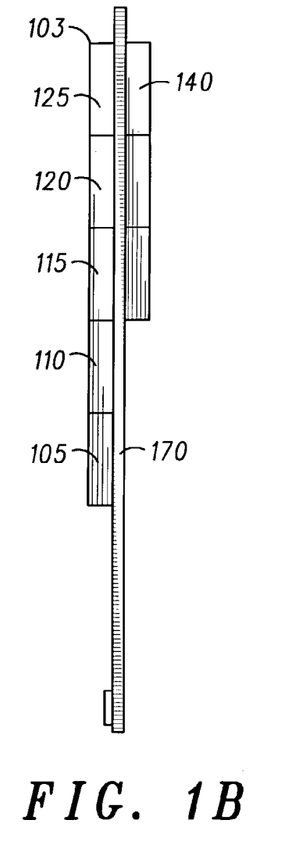
Figure 1C:
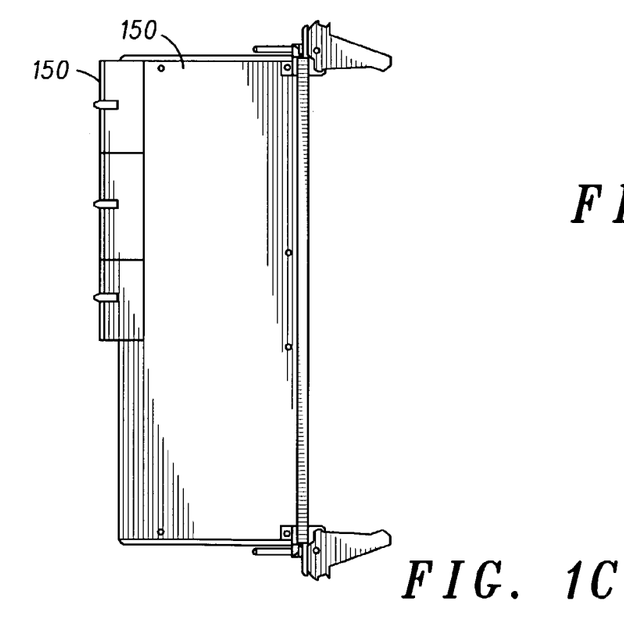

FIG. 1 is an exploded side view of a CompactPCI™ backplane 170. The CompactPCI backplane 170 may be coupled to CompactPCI boards 130 and transition boards 150. CompactPCI boards 130 couple to the front of the backplane 170 in various receivers, or slots. Transition boards 150 couple to the rear of the backplane 170. Transition boards 150 allow for cabling connections from the rear of the backplane 170.

The CompactPCI backplane 170 is comprised of a plurality of columns of front connectors 103, and a plurality of columns of rear connectors 140. The plurality of columns of front connectors 103 are divided into a plurality of rows. FIG. 1 illustrates a side view of a single one of the plurality of columns of front connectors 103 that is comprised of five rows of connectors 105, 110, 115, 120, and 125. The various rows are described in more detail in FIG. 2 hereinafter.

Figure 2:
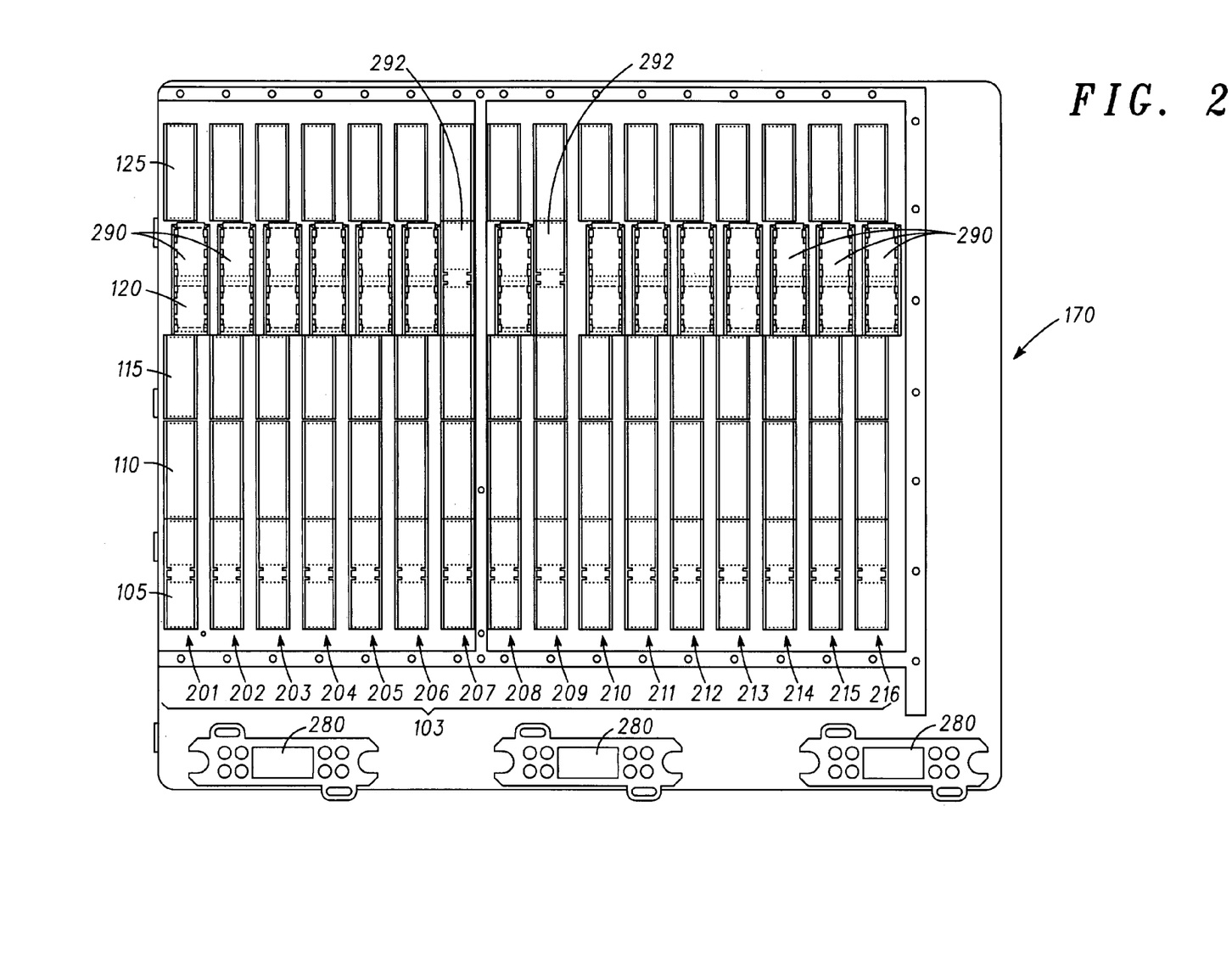
FIG. 2 is a front view of the CompactPCI backplane in accordance with an embodiment of the invention.

FIG. 2 is a front view of the CompactPCI backplane 170. The CompactPCI backplane 170 is comprised of a plurality of board receivers 201 through 206, 208, and 210 through 216, and CPU receivers 207 and 209 that form the plurality of columns of front connectors 103. Receivers 201 through 216 allow adapter boards such as CompactPCI boards 130 (FIG. 1) to connect directly to the backplane 170. In this illustration, there are 16 receivers 201 through 216 available for connection. Each of the receivers 201 through 216 is comprised of 5 rows of connectors 105, 110, 115, 120, and 125 that comport with CompactPCI specifications. The rows of connectors 105, 110, 115, 120, and 125 are referred to as P1, P2, P3, P4 and P5 connectors with P1 connectors being the bottom row of connectors 105 on the backplane 170 and with P5 connectors being the top row of connectors 125 on the backplane 170. The P1, P2, P3, and P5 connectors are of the same family of connectors, but may be different types of connectors within the family. As an example, the IEC 61074 family of connectors can be used for the P1, P2, P3, and P5 connectors.

Under CompactPCI specifications, the P4 connectors are reserved for a user-defined connection. In an embodiment of the invention, P4 connectors in board receivers 201 through 206, 208 and 210 through 216 are comprised of high speed data transport connectors 290, which are of a different family of connectors than the connectors in the other four rows of connectors 105, 110, 115, 125. To incorporate two different families of connectors on the same CompactPCI backplane 170, two different grid spacing systems may be used simultaneously. For example, in an embodiment of the invention, a standard IEC 61074 connector may be used in the P1, P2, P3, and P5 connector rows 105, 110, 115, 125 and may be arranged across the CompactPCI backplane 170 in a 2 millimeter (mm) grid spacing system. In this same embodiment, a connector in a different family of connectors is used in the P4 connector row 120 in board receivers 201 through 206, 208 and 210 through 216 and may be arranged across the CompactPCI backplane 170 in a 0.1 mm grid spacing system. The different grid systems allow the different families of connectors to co-exist on the same backplane 170 while complying with the backplane's physical dimension constraints and CompactPCI specifications.

The P4 connectors in board receivers 201 through 206, 208 and 210 through 216 preferably provide increased data transfer capabilities with improved noise and interference characteristics. As an example, an HS3 connector commercially available from AMP Incorporated, a company incorporated in the state of Pennsylvania, may be used to provide an increased volume and an increased rate of data transfer while reducing noise and interference. HS3 connector layouts are described in further detail in FIG. 4 hereinafter.

P4 connectors in CPU receivers 207 and 209 are CPU connectors 292. The CPU connectors 292 may be of the same family as the P1, P2, P3, and P5 connectors. Thus, CPU receivers 207 and 209 may each be comprised of five connectors all in the same family of connectors.

Certain CompactPCI boards 130 (FIG. 1) may be devoid of a connector, or mating portion, at a J4 location that would otherwise be coupled to a P4 connector. The backplane 170 is configured in such a way that CompactPCI boards 130 (FIG. 1) devoid of J4 connectors are still compatible with the backplane 170 and may be used in the system similarly to CompactPCI boards 130 (FIG. 1) that include a compatible connector at the J4 location.

Figure 3:
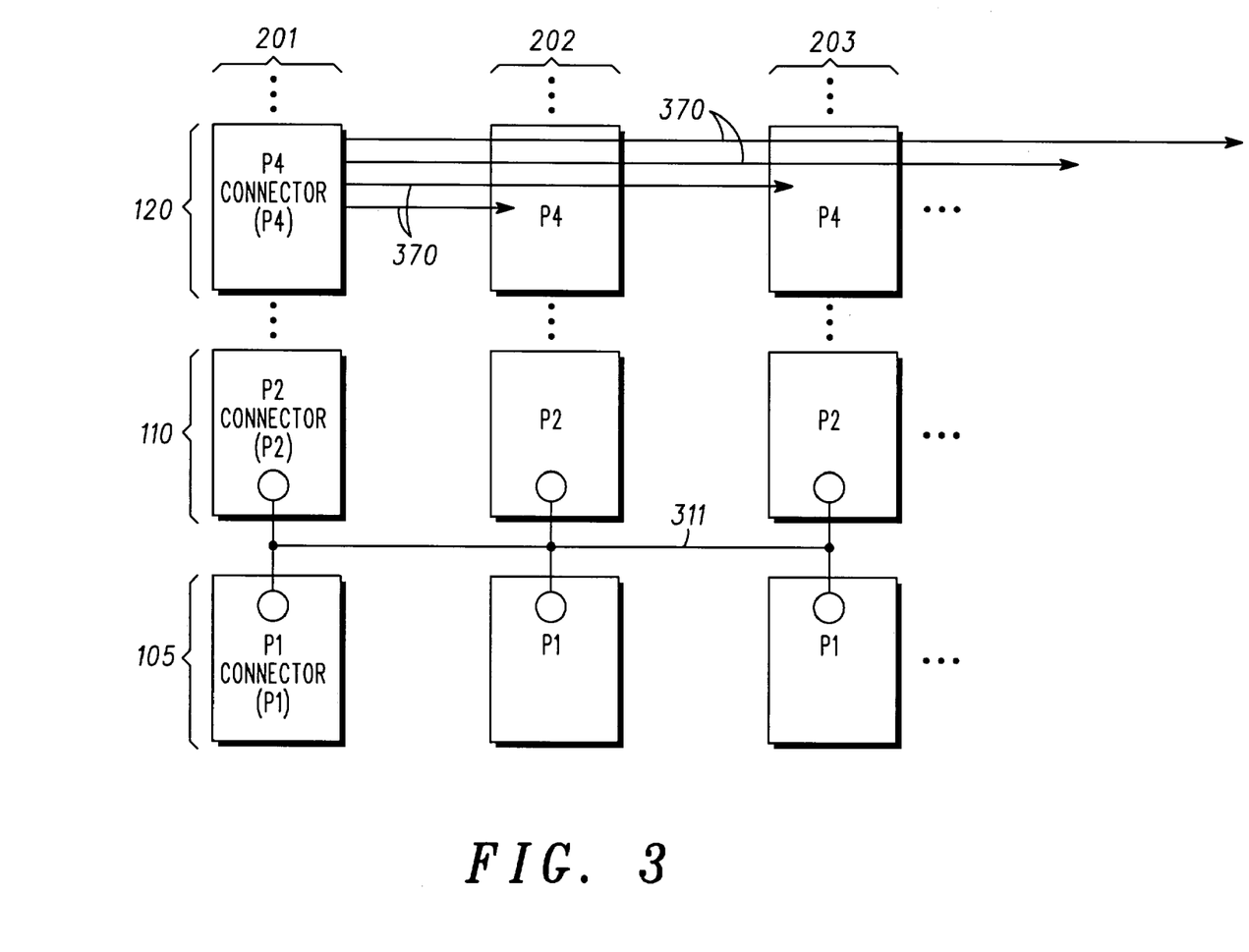
FIG. 3 is a block diagram of a portion of the CompactPCI backplane utilizing differential signaling in a fully meshed orthogonal network in accordance with an embodiment of the invention.

FIG. 3 is a partial block diagram of the internal connections of the CompactPCI backplane 170 (FIG. 2). A PCI bus 311 connects an A side of the CompactPCI backplane 170 (FIG. 2) between the P1 and P2 connectors of receivers 201 through 208. A second PCI bus (not shown in FIG. 3) connects a B side of the CompactPCI backplane 170 (FIG. 2) between the P1 and P2 connectors from the receivers 209 through 216 (FIG. 2). The PCI bus is a network circuit arrangement in which all devices are attached directly to a line and all signals pass through each of the devices. Each device has a unique identity and can recognize those signals intended for it.

The P4 connectors in board receivers 201 through 206 and 208 interconnect to form a portion of a meshed orthogonal network 370. The P4 connectors in board receivers 210 through 216 (FIG. 2) interconnect with each other and with the P4 connectors in board receivers 201 through 206 and 208 to form the fully meshed orthogonal network 370, as further described in FIG. 5 hereinafter.

Figure 4:
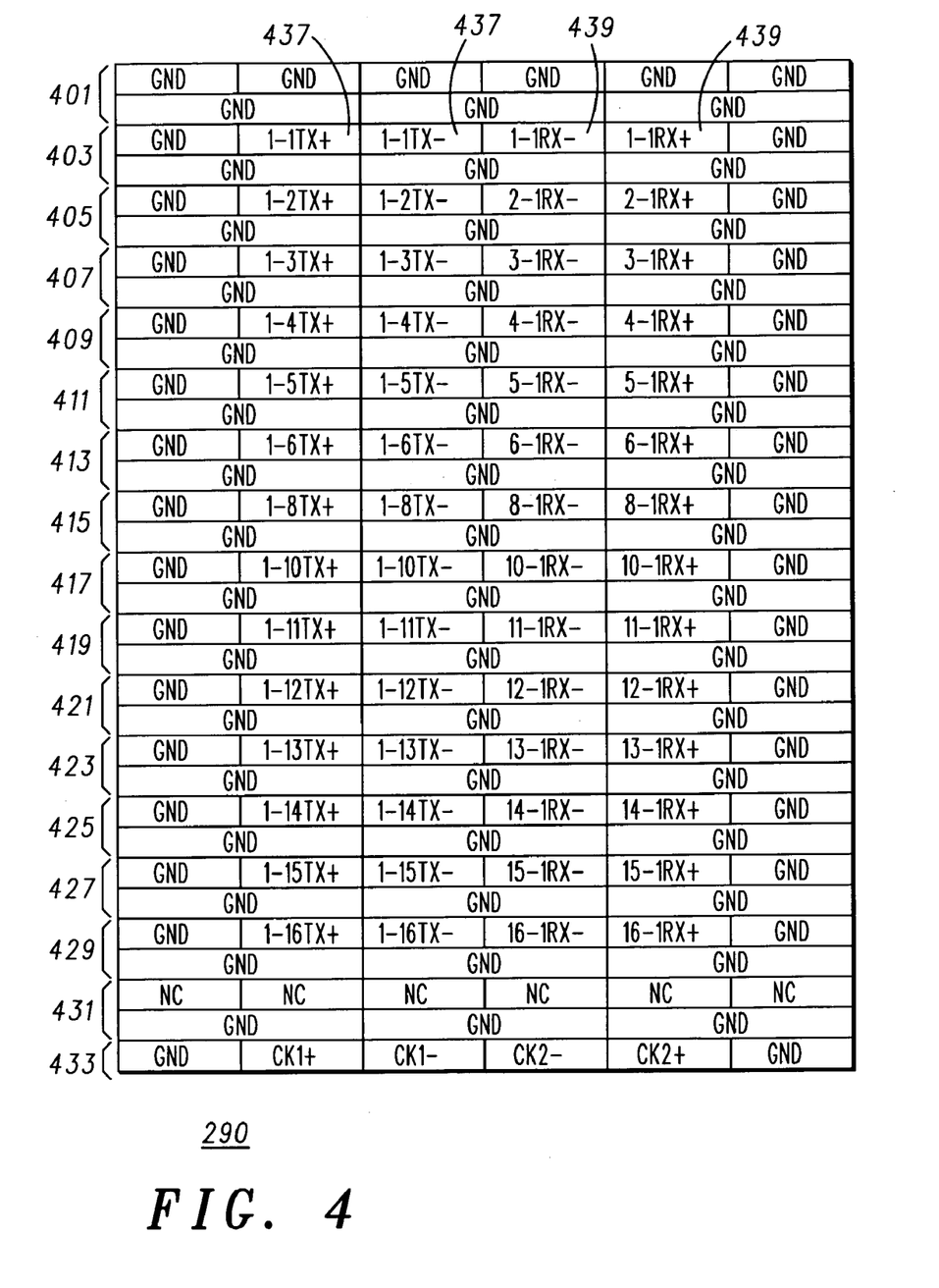
FIG. 4 is a pinout diagram for a P4 connector in the CompactPCI backplane in accordance with an embodiment of the invention.

FIG. 4 illustrates a pinout configuration of one of the data transport connectors 290 for board receivers 201 through 206, 208 and 210 through 216 (FIG. 2). Data transport connector 290 includes a shield row 401 and channels 403, 405, 407, 409, 411, 413, 415, 417, 419, 421, 423, 425, 427, 429, a no connection row 431, and a clock row 435. Shield row 401 contains ground pins or lines surrounding internal connection lines to provide protection from noise and interference. Channels 403, 405, 407, 409, 411, 413, 415, 417, 419, 421, 423, 425, 427, 429 are each comprised of a pair of transmit lines 437 and a pair of receive lines 439, and are horizontally surrounded by ground pins and vertically surrounded by rows of ground lines for further shielding and noise and interference protection. The pairs of transmit lines 437 and the pairs of receive lines 439 each employ differential signaling on the CompactPCI boards 130 (FIG. 1) connected to the CompactPCI backplane 170 (FIG. 2) at board receivers 201 through 206, 208 and 210 through 216 (FIG. 2). Thus, two signal lines are required for each signal.

Conventional single-ended signal detection often employed by the CompactPCI bus architecture requires detection of a signal level (high or low) with respect to ground. Capacitive cross-coupling between the signal lines and ground results in an electromagnetic field. Energy is thus expended during transfer of information on the bus for charging and discharging bus capacitances. A differential signal requires two lines per signal, and information is transferred by detecting either a polarity or a magnitude of a voltage difference between the two signal lines. Pairs of transmit lines 437 preferably transmit signals that are equal in magnitude, but opposite in polarity. That is, if one signal line of a pair of transmit lines 437 carries a signal of +1.0 volts (V), the second signal line of the same pair of transmit lines 437 simultaneously carries a signal of −1.0 V. As a result, the electromagnetic field between a pair of signal lines and ground is negligible because the electromagnetic field between one signal line and ground cancels the electromagnetic field between the other signal line and ground.

Only the electromagnetic field between signal lines in a pair of signal lines remains significant. The electromagnetic field formed between differential signal lines in a pair of signal lines is much smaller and more localized than the electromagnetic field between a conventional single-ended signal line and ground. Therefore, when compared to the conventional signaling environment, a much lower signal transition is required to transfer information. Less energy is expended on the bus charging and discharging capacitance during transfer of information. Moreover, utilizing differential signaling improves noise immunity and allows higher transfer rates to be achieved. By providing both positive and negative signaling on the pairs of transmit lines 437 and the pairs of receive lines 439, noise and interference is placed on both positive and negative signal lines rather than on a single signal line. With the differential aspect, signals are viewed for differing characteristics, with common characteristics, such as common noise aspects, being cancelled out.

No connection row 431 is situated immediately underneath channel 429. In the preferred embodiment where an AMP HS3 connector is used for data transport connector 290, no connection row 431 is repeated up to four times between channel 429 and a clock row 435. Alternatively, some of the repeated ones of no connection row 431 can be converted into additional channel rows, particularly when additional board receivers are used in the backplane 170. Differential clock connections are situated on the clock row 435 located immediately beneath the no connection row 431. The clock row 435 is included to comport with CompactPCI specifications.

The connector with the pinout configuration illustrated in FIG. 4 may require a lower impedance of 50 ohms than that required by the first family of connectors used for the P1, P2, P3 and P5 connectors, which is approximately 65 ohms. The backplane 170 (FIG. 2) is configured to provide 50 ohms impedance to the P4 connectors in board receivers 201 through 206, 208 and 210 through 216 (FIG. 2) while maintaining a 65 ohm impedance for all of the P1, P2, P3, and P5 connectors and for the P4 connectors in the CPU receivers 207 and 209 (FIG. 2).

Figure 5:
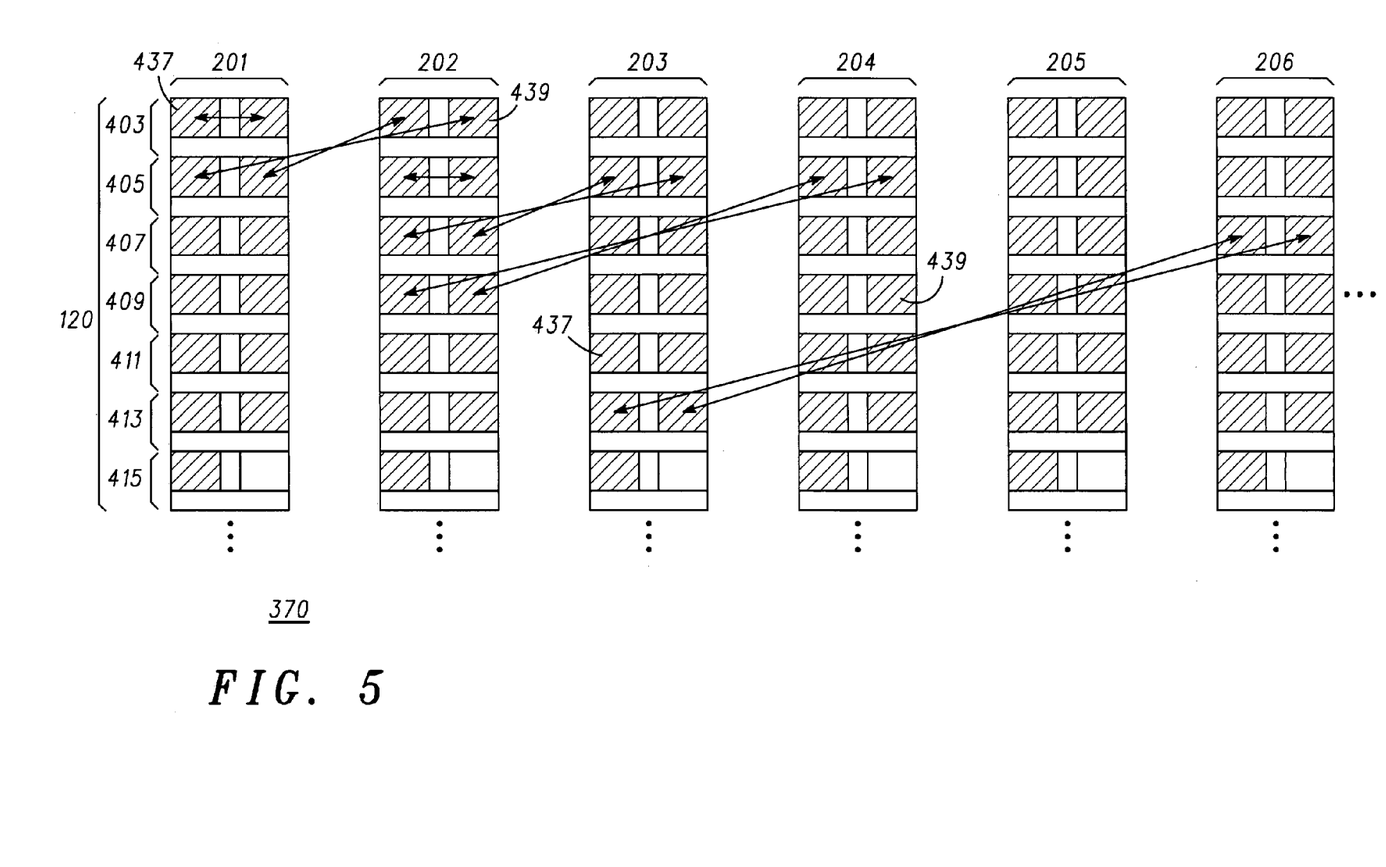
FIG. 5 is an illustration of a portion of a fully meshed orthogonal network in the CompactPCI backplane in accordance with an embodiment of the invention.

FIG. 5 illustrates a portion of a point-to-point network in the P4 connectors of board receivers 201 through 206, 208 and 210 through 216 (FIG. 2) that create the fully meshed orthogonal network 370 described in FIG. 3. As described in FIG. 4, the P4 connectors in board receivers 201 through 206, 208 and 210 through 216 (FIG. 2) are comprised of a plurality of channels 403, 405, 407, 409, 411, 413, 415, 417, 419, 421, 423, 425, 427, and 429 that are each comprised of pairs of differential transmit and receive lines 437, 439. FIG. 5 shows the P4 connectors for the first seven channels 403, 405, 407, 409, 411, 413, and 415 in the first six board receivers 201 through 206.

The pair of transmit lines 437 in board receiver 201 of the channel 403 is coupled to the pair of receive lines 439 in board receiver 201 of the channel 403. The pair of transmit lines 437 in board receiver 201 of the channel 405 is coupled to the pair of receive lines 439 of the channel 403 of board receiver 202, and the pair of transmit lines 437 of the channel 403 of board receiver 202 is coupled to the pair of receive lines 439 of the channel 405 of board receiver 201. The pair of transmit lines 437 in board receiver 201 of the channel 407 is coupled to the pair of receive lines 439 of channel 403 in board receiver 203, and the pair of transmit lines 437 of channel 403 in board receiver 203 is coupled to the pair of receive lines 439 of the channel 407 in board receiver 201 (not shown in FIG. 5).

By way of further example, the pair of transmit lines 437 in the channel 405 of board receiver 202 is coupled to the pair of receive lines 439 of the channel 405 of board receiver 202. This coupling is made because a second channel in a second row of connectors is connected to a second channel in a second column of connectors to maintain orthogonality.

The pair of transmit lines 437 in the channel 407 in board receiver 202 is coupled to the pair of receive lines 439 of the channel 405 in board receiver 203, and the pair of transmit lines 437 in the channel 405 in board receiver 203 is coupled to the pair of receive lines 439 of the channel 407 in board receiver 202. Also, the pair of transmit lines 437 in the channel 407 of board receiver 203 is coupled to the pair of receive lines 439 of the channel 407 of board receiver 203 (not shown in FIG. 5).

Moreover, the pair of transmit lines 437 in the channel 409 in board receiver 202 is coupled to the pair of receive lines 439 of the channel 405 in board receiver 204, and the pair of transmit lines 437 in the channel 405 of board receiver 204 is coupled to the pair of receive lines 439 in the channel 409 in board receiver 202. The pair of transmit lines 437 in the channel 413 of board receiver 203 is coupled to the pair of receive lines 439 of the channel 407 of board receiver 206, and the pair of transmit lines 437 of the channel 407 of board receiver 206 is coupled to the pair of receive lines 439 of the channel 413 of board receiver 203. All slots and channels are connected in a similar manner to form the fully meshed orthogonal network 370. The CPU connectors 292 (FIG. 2) in CPU receivers 207 and 209 (FIG. 2) are not a part of the interconnected fully meshed orthogonal network 370.

The network 370 permits, as an example, a first board receiver 201 to transfer data directly to a second board receiver 202, a third board receiver 203, or to itself 201. The data does not need to be routed to a different part of the computer system before being transferred to the final destination. Similarly, network 370 permits, as another example, the second board receiver 202 to transfer different data directly to the first board receiver 201, the third board receiver 203, or to itself 202, and network 370 also permits, as a further example, the third board receiver 203 to transfer data directly to the first board receiver 201, the second board receiver 202 or to itself 203.

Although certain specific embodiments have been described herein, it will be apparent to those skilled in the art that variations and modifications of such embodiments contained hereinbefore may be made without departing from the spirit and scope of the invention. For example, certain connector types of any particular family may be substituted for a compatible connector within the same family of connectors. Accordingly, it is intended that the invention shall be limited only to the extent required by the appended claims.

What is claimed is:

1. A Compact peripheral component interconnect (CompactPCI) backplane comprising:
   a plurality of CompactPCI connectors;
   a plurality of channels in each CompactPCI connector of a portion of said plurality of CompactPCI connectors;
   wherein:
      said pluralities of channels are interconnected to form an orthogonal network;
   a plurality of first CompactPCI connectors;
   a plurality of second CompactPCI connectors adjacent to said plurality of first CompactPCI connectors;
   a plurality of third CompactPCI connectors adjacent to said plurality of CompactPCI connectors;
   a plurality of fifth CompactPCI connectors adjacent to said plurality of CompactPCI connectors; and
   N board receivers;
   wherein:
      said plurality of CompactPCI connectors are a plurality of fourth CompactPCI connectors;
      N is an integer greater than two;
      a first one of said N board receivers is comprised of a first one of said plurality of first CompactPCI connectors, a first one of said plurality of second CompactPCI connectors, a first one of said plurality of third CompactPCI connectors, a first one of said portion of said plurality of CompactPCI connectors, and a first one of said plurality of fifth CompactPCI connectors;
      a second one of said N board receivers adjacent to said first one of said N board receivers is comprised of a second one of said plurality of first CompactPCI connectors, a second one of said plurality of second CompactPCI connectors, a second one of said plurality of third CompactPCI connectors, a second one of said portion of said plurality of CompactPCI connectors, and a second one of said plurality of fifth CompactPCI connectors; and a third one of said N board receivers adjacent to said second one of said N board receivers is comprised of a third one of said plurality of first CompactPCI connectors, a third one of said plurality of second CompactPCI connectors, a third one of said plurality of third CompactPCI connectors, a third one of said portion of said plurality of CompactPCI connectors, and a third one of said plurality of fifth CompactPCI connectors.

2. The CompactPCI backplane of claim 1 wherein:

said pluralities of first, second, third, and fifth CompactPCI connectors are CompactPCI connectors in a first family; and said portion of said plurality of CompactPCI connectors are comprised of N CompactPCI connectors in a second family different from said first family.

3. The CompactPCI backplane of claim 1 wherein:

said plurality of channels in each CompactPCI connector of said portion of said plurality of CompactPCI connectors are comprised of N channels; and said N channels in each CompactPCI connector of said portion of said plurality of CompactPCI connectors in said N board receivers form said orthogonal network.

4. The CompactPCI backplane of claim 1 wherein:

said plurality of channels in each CompactPCI connector of said portion of said plurality of CompactPCI connectors are comprised of M channels;

M is an integer greater than N; and said M channels in each CompactPCI connector of said portion of said plurality of CompactPCI connectors in said N board receivers form said orthogonal network.

5. The CompactPCI backplane of claim 1 comprising:

a pair of transmit lines in each of said plurality of channels in each CompactPCI connector of said portion of said plurality of CompactPCI connectors;

a pair of receive lines adjacent to said pair of transmit lines in each of said plurality of channels in each CompactPCI connector of said portion of said plurality of CompactPCI connectors;

ground lines adjacent to said transmit and receive lines in each of said plurality of channels in each CompactPCI connector of said portion of said plurality of CompactPCI connectors;

wherein:

said ground lines of a first one of said plurality of channels in each CompactPCI connector of said portion of said plurality of CompactPCI connectors and said ground lines of a second one of said plurality of channels in each CompactPCI connector of said portion of said plurality of CompactPCI connectors form an electrical shield around said pairs of transmit and receive lines in said first one of said plurality of channels in each CompactPCI connector of said portion of said plurality of CompactPCI connectors; and said first and second ones of said plurality of channels in each CompactPCI connector of said portion of said plurality of CompactPCI connectors are adjacent to each other.

6. The CompactPCI backplane of claim 1 wherein said orthogonal network comprises:

a first one of said plurality of channels in said first one of said N board receivers is coupled to itself;

a first one of said plurality of channels in said second one of said N board receivers is coupled to a second one of said plurality of channels in said first one of said N board receivers; and a first one of said plurality of channels in said third one of said N board receivers is coupled to a third one of said plurality of channels in said first one of said N board receivers.

7. The CompactPCI backplane of claim 1 comprising:

a transmit portion and a receive portion in each of said plurality of channels in each CompactPCI connector of said portion of said plurality of CompactPCI connectors.

8. The CompactPCI backplane of claim 2 comprising:

a CompactPCI board inserted into said first one of said N board receivers;

wherein:

said CompactPCI board has a first mating portion for said first one of said plurality of first CompactPCI connectors, a second mating portion for said first one of said plurality of second CompactPCI connectors, a third mating portion for said first one of said third CompactPCI connectors, and a mating portion of said first one of said plurality of fifth CompactPCI connectors; and said CompactPCI board is devoid of a mating portion for said first one of said portion of said plurality of CompactPCI connectors.

9. The CompactPCI backplane of claim 2 comprising:

a CPU receiver to receive a central processing unit (CPU) board;

wherein:

said CPU receiver is adjacent to said first one of said N board receivers;

said CPU receiver is comprised of an (N+1)th one of said plurality of first CompactPCI connectors, an (N+1)th one of said plurality of second CompactPCI connectors, an (N+1)th one of said plurality of third CompactPCI connectors, an (N+1)th one of said plurality of CompactPCI connectors, and an (N+1)th one of said plurality of fifth CompactPCI connectors;

said (N+1)th one of said plurality of CompactPCI connectors is a CompactPCI connector of said first family; and said (N+1)th one of said plurality of CompactPCI connectors is absent from said portion of said plurality of CompactPCI connectors.

10. The CompactPCI backplane of claim 5 comprising:

additional ground lines in each CompactPCI connector of said portion of said plurality of CompactPCI connectors forming a shield row adjacent to said first one of said plurality of channels in each CompactPCI connector of said portion of said plurality CompactPCI connectors to provide protection for said pairs of transmit and receive lines in each of said plurality of channels in each CompactPCI connector of said portion of said plurality of CompactPCI connectors from interference and noise for high density data transport; and further ground lines in each CompactPCI connector of said portion of said plurality of CompactPCI connectors forming a shield row adjacent to an Nth one of said plurality of channels in each CompactPCI connector of said portion of said plurality of CompactPCI connectors to provide protection for said pairs of transmit and receive lines in each of said plurality of channels in each CompactPCI connector of said portion of said plurality of CompactPCI connectors from interference and noise for high density data transport.

11. The CompactPCI backplane of claim 6 wherein said orthogonal network comprises:
a second one of said plurality of channels in said second one of said N board receivers is coupled to itself; and
a second one of said plurality of channels in said third one of said N board receivers is coupled to a third one of said plurality of channels in said second one of said N board receivers.

12. The CompactPCI backplane of claim 7 wherein said orthogonal network comprises:
said transmit portion of a first one of said plurality of channels in said first one of said N board receivers is coupled to said receive portion of said first one of said plurality of channels in said first one of said N board receivers;
said transmit portion of a first one of said plurality of channels in said second one of said N board receivers is coupled to said receive portion of a second one of said plurality of channels in said first one of said N board receivers; and
said transmit portion of a first one of said plurality of channels in said third one of said N board receivers is coupled to said receive portion of a third one of said plurality of channels in said first one of said N board receivers.

13. The CompactPCI backplane of claim 11 wherein said orthogonal network comprises:
a third one of said plurality of channels in said third one of said N board receivers is coupled to itself.

14. The CompactPCI backplane of claim 12 wherein said orthogonal network comprises:
said transmit portion of a second one of said plurality of channels in said second one of said N board receivers is coupled to said receive portion of said second one of said plurality of channels in said second one of said N board receivers; and
said transmit portion of a second one of said plurality of channels in said third one of said N board receivers is coupled to said receive portion of a third one of said plurality of channels in said second one of said N board receivers.

15. The CompactPCI backplane of claim 14 wherein:
said transmit portion of a third one of said plurality of channels in said third one of said N board receivers is coupled to said receive portion of said third one of said plurality of channels in said third one of said N board receivers.

* * * * *